United States Patent
Groves et al.

(10) Patent No.: US 6,884,527 B2
(45) Date of Patent: Apr. 26, 2005

(54) BIAXIALLY TEXTURED COMPOSITE SUBSTRATES

(75) Inventors: James R. Groves, Los Alamos, NM (US); Stephen R. Foltyn, Los Alamos, NM (US); Paul N. Arendt, Los Alamo, NM (US)

(73) Assignee: The Regents of the University of California, Los Alamos, MN (US)

( * ) Notice: Subject to any disclaimer, the term of this patent is extended or adjusted under 35 U.S.C. 154(b) by 0 days.

(21) Appl. No.: 10/624,348

(22) Filed: Jul. 21, 2003

(65) Prior Publication Data

US 2005/0019615 A1 Jan. 27, 2005

(51) Int. Cl.⁷ .......................... B32B 19/00; B32B 9/00; H01B 12/00; H01F 6/00; H01L 39/00
(52) U.S. Cl. ...................... 428/701; 505/237; 505/238
(58) Field of Search ................. 505/230, 237, 505/238; 428/701, 702, 930; 174/125.1

(56) References Cited

U.S. PATENT DOCUMENTS

| | | | | |
|---|---|---|---|---|
| 5,015,623 A | * | 5/1991 | Scholten | 505/329 |
| 5,135,906 A | * | 8/1992 | Harada et al. | 505/237 |
| 5,252,551 A | * | 10/1993 | Wu et al. | 505/220 |
| 5,262,394 A | * | 11/1993 | Wu et al. | 505/237 |
| 5,278,138 A | * | 1/1994 | Ott et al. | 505/446 |
| 5,432,151 A | * | 7/1995 | Russo et al. | 505/474 |
| 5,523,284 A | * | 6/1996 | Fagan et al. | 505/501 |
| 5,545,611 A | * | 8/1996 | Nakamura | 505/238 |
| 5,650,378 A | * | 7/1997 | Iijima et al. | 505/473 |
| 5,872,080 A | * | 2/1999 | Arendt et al. | 505/238 |
| 6,461,415 B1 | | 3/2000 | Sambasivan | |
| 6,055,446 A | * | 4/2000 | Kroeger et al. | 505/230 |
| 6,060,433 A | * | 5/2000 | Li et al. | 505/473 |
| 6,248,392 B1 | * | 6/2001 | Terpstra et al. | 427/2.26 |
| 6,251,834 B1 | * | 6/2001 | Glowacki et al. | 505/239 |
| 6,251,835 B1 | * | 6/2001 | Chu et al. | 505/411 |
| 6,271,474 B1 | * | 8/2001 | Fujikami et al. | 174/125.1 |
| 6,036,762 A1 | | 10/2002 | Sambasivan et al. | |
| 6,756,139 B2 | * | 6/2004 | Jia et al. | 428/701 |
| 2003/0138673 A1 | | 7/2003 | Sambasivan et al. | |
| 2004/0011245 A1 | | 1/2004 | Sambasivan et al. | |
| 2004/0138058 A1 | | 7/2004 | Sambasivan et al. | |

* cited by examiner

Primary Examiner—Colleen P. Cooke
(74) Attorney, Agent, or Firm—Bruce H. Cottrell

(57) ABSTRACT

An article including a substrate, a layer of a metal phosphate material such as an aluminum phosphate material upon the surface of the substrate, and a layer of an oriented cubic oxide material having a rock-salt-like structure upon the metal phosphate material layer is provided together with additional layers such as a HTS top-layer of YBCO directly upon a layer of a buffer material such as a $SrTi_xRu_{1-x}O_3$ layer.

16 Claims, 1 Drawing Sheet

Biaxially oriented MgO synthetic Aluminum phosphate

Metal substrate

BIAXIALLY TEXTURED COMPOSITE SUBSTRATES

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to biaxially textured composite substrates for subsequent deposition of high temperature superconducting thick films with high $J_c$'s and $I_c$'s.

BACKGROUND OF THE INVENTION

One process in the production of coated conductors (superconductive tapes or films) has been referred to as a thick film process. In the deposition of thick films for such coated conductors where the thickness of the superconductive layer is generally at least one micron in thickness, the use of polycrystalline substrates, e.g., polycrystalline metal substrates has been preferred. Buffer layers play an important role in the production of high critical current density superconducting films on polycrystalline metal substrates. Suitable buffer layers can provide the necessary structural template for subsequently deposited superconducting layers. For example, a yttria-stabilized zirconia (YSZ) buffer layer deposited by ion beam assisted deposition (IBAD) has been described by both Iijima et al., U.S. Pat. No. 5,650,378, and Russo et al., U.S. Pat. No. 5,432,151. Similarly, Arendt et al., U.S. Pat. No. 5,872,080 described a coated conductor having the structure $YBCO/Y_2O_3/YSZ/Al_2O_3/Ni$ alloy with a high critical current density ($J_c$) of about $1\times10^6$ A/cm$^2$ and a high transport critical current ($I_c$) of from about 100 to about 200 A/cm. While this current was satisfactory, the deposition of the YSZ layer was considered too slow for commercial production.

U.S. Pat. No. 6,190,752, Do et al., described thin films of a material having a rock salt-like structure deposited by IBAD upon amorphous substrate surfaces. Their preferred material having a rock salt-like structure was magnesium oxide (MgO). In comparison to the deposition of YSZ, MgO can be rapidly deposited through an IBAD process. The structures of U.S. Pat. No. 6,190,752 included, e.g., $YBCO/Y_2O_3/YSZ/MgO/MgO(IBAD)/Si_3N_4/Ni$ alloy with a NiO layer in between the YSZ layer and the MgO layer in most instances. Despite the improvement in processing speeds, their structures had $I_c$'s of only about 50 to about 75 A/cm. In addition, at the elevated processing temperatures needed to form the superconductive layer, the silicon nitride layer can react with other materials in the system.

WO 02/47119, Arendt et al., described substrate structures including a layer of an inert oxide material such as aluminum oxide on the surface of the polycrystalline metallic substrate, a layer of an amorphous oxide or oxynitride material such as yttrium oxide or aluminum oxynitride on the inert oxide material layer, and, a layer of an oriented cubic oxide material having a rock-salt-like structure such as magnesium oxide upon the amorphous oxide or oxynitride material layer. One exemplary structure described in WO 02/47119 included, e.g., $YBCO/CeO_2/YSZ/MgO(IBAD)/Y_2O_3/Al_2O_3/Ni$ alloy. The critical current density ($J_c$) was measured as $1.4\times10^6$ A/cm$^2$ using a standard four-point measurement. The projected transport critical current ($I_c$) was 210 Amperes across a sample 1 cm wide. WO 02/47119 also described a structure wherein a single layer of erbium oxide ($Er_2O_3$) was between the metal substrate and the IBAD-MgO layer.

Despite the prior results shown by Do et al. and Arendt et al., continued improvements in the structure and resultant properties of coated conductors have been desired. Specifically, the present IBAD MgO systems have some drawbacks that detract from their viability as a template layer for long length processing of coated conductors. The two biggest limitations are: (1) the general use of two layers, one layer used as a diffusion barrier and the second used as a nucleation layer; and (2) the need to deposit IBAD MgO films on very smooth substrates(<2 nm rms). After extensive and careful investigation, improvements have now been found in the composite substrate architecture for subsequent preparation of superconducting films thereon. In particular, a single layer has been found to substitute for the previous diffusion barrier and nucleation layers.

It is an object of the present invention to provide superconducting films, especially YBCO superconducting films, on polycrystalline substrates such resultant articles demonstrating properties such as high $J_c$'s and $I_c$'s.

It is another object of the present invention to provide structural template articles for subsequent deposition of oriented films, e.g., superconducting films, especially YBCO superconducting films.

SUMMARY OF THE INVENTION

To achieve the foregoing and other objects, and in accordance with the purposes of the present invention, as embodied and broadly described herein, the present invention provides an article including a substrate, a layer of a metal phosphate material upon the surface of the substrate, and a layer of an oriented cubic oxide material having a rock-salt-like structure upon the metal phosphate layer. In a preferred embodiment, the metal phosphate material is an aluminum phosphate material. In another preferred embodiment, the article is a superconductive article and further includes an overlayer of a HTS material. One or more buffer layers can be included between the HTS layer and the layer of an oriented cubic oxide material.

The present invention also provides a thin film template structure including a flexible polycrystalline metal substrate, a layer of a metal phosphate material upon the surface of the flexible polycrystalline metal substrate, and a layer of an oriented cubic oxide material having a rock-salt-like structure upon the metal phosphate layer. In a preferred embodiment, the metal phosphate material is an aluminum phosphate material. The thin film template structures of the present invention are useful for subsequent epitaxial growth of perovskite oxide thin films.

DETAILED DESCRIPTION

Figure 1:
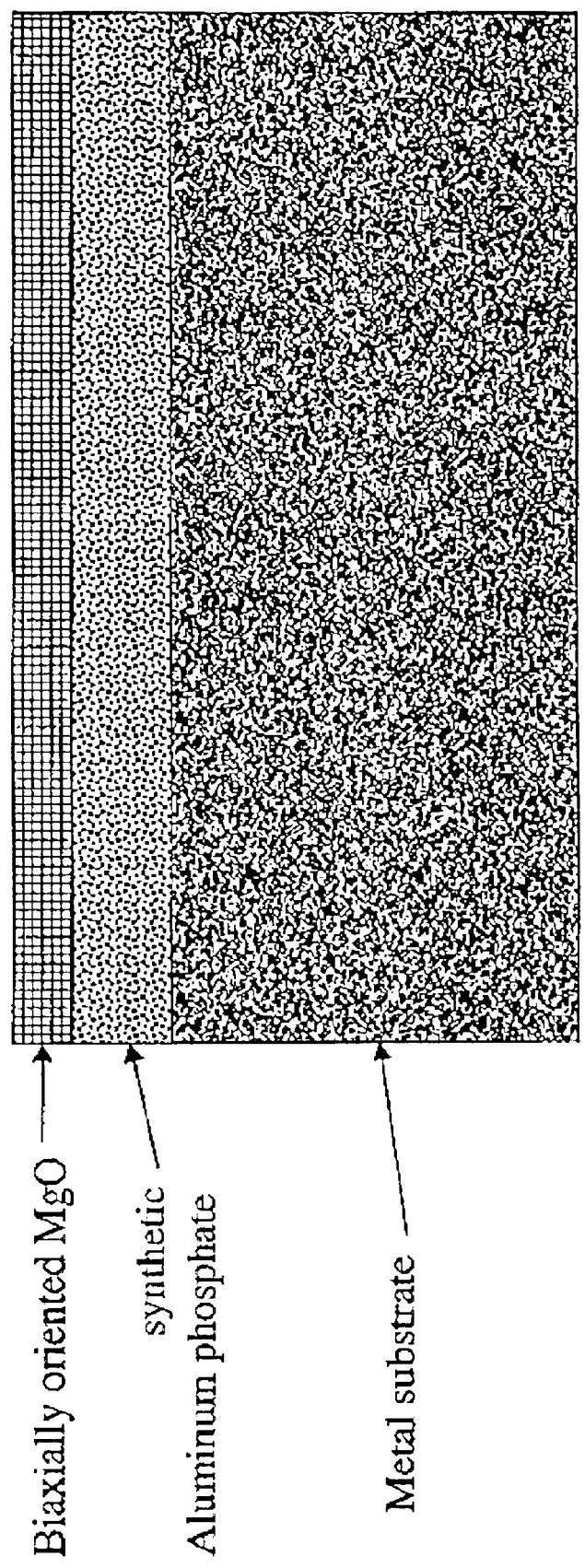
FIG. 1 shows an illustrative structure of a superconductive article in accordance with the present invention.

The present invention is concerned with high temperature superconducting wires or tapes and the use of high temperature superconducting thick films to form such wires or tapes. The present invention is further concerned with the preparation of structural template articles for the subsequent deposition of oriented films, e.g., superconducting thick films.

In the preferred embodiment of the present invention, a single layer of a metal phosphate material such as aluminum phosphate is deposited prior to a MgO layer. FIG. 1 shows a generic architecture of the present invention. The MgO layer is a composite layer and is formed preferably of a thin layer of IBAD-MgO with a layer of homoepitaxial MgO thereon. This MgO layer is used as a template for subsequent heteroepitaxial growth of one or more buffer layers, with the one or more buffer layers used for subsequent heteroepitaxial growth of YBCO films. The one or more buffer layers also can serve as a barrier layer to reduce interactions between the underlying layers and substrate with the YBCO film.

The growth of high performance YBCO films on polycrystalline Ni-alloy substrates using an aluminum phosphate layer has been successfully demonstrated where IBAD-MgO is used as a template. Other metal phosphate materials may be used as well.

Among useful buffer layers between the IBAD-deposited MgO and a subsequently deposited superconducting material can be included a homoepitaxial layer of MgO, a layer of strontium ruthenate ($SrRuO_3$), a layer of strontium titanate ($SrTiO_3$) or a layer of a blend of strontium titanate and strontium ruthenate such as a 50/50 percent by weight blend.

The aluminum phosphate layers/films deposited by on metal substrates were quite smooth. An average RMS of about 2 nm was typical for a scan area across 4 by 4 micron. As a comparison, the average RMS for the IBAD-MgO on a metal substrate was around 1.0 nm across the same scan area.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals such as, e.g., erbium, samarium, neodymium, europium, gadolinium, holmium, ytterbium, or dysprosium, as a substitute for some or all of the yttrium as is well known, may also be used. Other superconducting materials such as bismuth and thallium based superconductor materials may also be employed. $YBa_2Cu_3O_{7-\delta}$ is preferred as the superconducting material. In addition, mixtures of superconducting materials may be used and multilayers of the same or differing superconducting materials may be used.

In the present invention, the initial or base substrate can be, e.g., any polycrystalline material such as a metal or a ceramic such as polycrystalline aluminum oxide or polycrystalline yttria-stabilized zirconia (YSZ). Preferably, the substrate can be a polycrystalline metal such as a nickel alloy. Suitable nickel alloys can include nickel alloys such as various Hastelloy metals, Haynes metals and Inconel metals. The base substrate may also be a textured metal or metal alloy, e.g., pure nickel, copper, nickel alloy or copper alloy as described by Goyal et al. in U.S. Pat. No. 5,741,377. Substrates from such a textured metal process are generally referred to as rolling assisted biaxially textured substrates (RABiTS). The metal substrate on which the superconducting material is eventually deposited should preferably allow for the resultant article to be flexible whereby superconducting articles (e.g., coils, motors or magnets) can be shaped. As such a metal substrate can have a rough surface, it can be mechanically polished, electrochemically polished or chemically mechanically polished to provide a smoother surface.

Substrates are prepared for subsequent IBAD MgO overcoatings by the following. If the initial metal substrate has a RMS roughness of less than about 15 nm, the metal substrate can be chemically mechanically polished (CMP) to a RMS roughness of about 1.5 nm over a couple of minutes. (Note: For measuring roughness, all scans are generally done using scanning force microscopy over a 5×5 $\mu m^2$ area.) A suitable polishing slurry can be commercially available colloidal silica. If the initial metal substrate has a RMS roughness of greater than about 15 nm, then the metal substrate is generally mechanically polished with a 1 micron or finer diamond paste for a short time period of from about 10 seconds to about 20 seconds to get the finish to about 4 nm to about 6 nm followed by a 2 minute CMP with silica as previously described. Preferably, the metal substrate can be electropolished in an acid bath as described by Kreiskott et al., Supercond. Sci. Technol., vol. 16, pp. 613–616 (2003).

After assuring the desired initial smoothness, the metal substrate can then be coated with a metal phosphate coating, e.g., an aluminum phosphate coating, as described by U.S. Pat. Nos. 6,461,415 and 6,036,762, such description incorporated herein by reference. In a preferred coating method, an aluminum phosphate layer is coated onto the metal substrate by dip coating followed by heating at temperatures of from about 750° C. to about 1300° C. to form an intermediate article including an aluminum phosphate top layer. The final metal phosphate, e.g., aluminum phosphate, layer may be either amorphous or crystalline.

Such intermediate articles provide an excellent substrate for the subsequent deposition of a layer of an oriented cubic oxide material having a rock-salt-like structure. Such oriented cubic oxide materials can be, e.g., magnesium oxide, calcium oxide, strontium oxide, zirconium oxide, barium oxide, europium oxide, samarium oxide and other materials such as described in U.S. Pat. No. 6,190,752 by Do et al. Preferably, the layer of oriented cubic oxide material having a rock-salt-like structure is a magnesium oxide (MgO) layer. Such a MgO layer is preferably deposited by electron beam or ion beam evaporation with an ion beam assist. The MgO layer in the ion beam assisted deposition is typically sputtered from a MgO target or for electron beam deposition is typically evaporated from a crucible of magnesia. An ion-assisted, electron-beam evaporation system similar to that described by Wang et al., App. Phys. Lett., vol. 71, no. 20, pp. 2955–2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°.

The ion source gas in the ion beam assisted deposition is preferably argon. The ion beam assisted deposition of MgO is conducted with substrate temperatures of generally from about 20° C. to about 100° C. The MgO layer deposited by the IBAD process is generally from about 5 nm to about 20 nm in thickness, preferably about 8 nm to about 15 nm. After deposition of the oriented cubic oxide material having a rock-salt-like structure, e.g., MgO, an additional thin homo-epitaxial layer of the same oriented cubic oxide material, e.g., MgO, can be optionally deposited by a process such as electron beam or magnetron sputter deposition. This thin layer can generally be about 10 nm to 100 nm in thickness. Deposition of the homo-epitaxial layer by such a process can be more readily accomplished than depositing the entire thickness by ion beam assisted deposition.

A thin film template structure is provided in accordance with the present invention and includes a substrate, a layer of a metal phosphate, such as aluminum phosphate, upon the surface of the substrate, and a layer of an oriented cubic oxide material having a rock-salt-like structure upon the metal phosphate layer. Such a thin film template structure is useful for subsequent deposition of epitaxial thin films. Such epitaxial thin films can be formed from a material selected from the group consisting of superconductors, including high temperature superconductors, semiconductors, photovoltaic materials, magnetic or ferromagnetic materials, and precursors of superconductors or high temperature superconductors. The thin film template structure is especially preferred for subsequent deposition of high temperature superconductor materials. Depending upon the particular epitaxial thin film material deposited upon the thin film template structure, additional layers such as buffer layers can be employed for enhanced chemical or structural compatibility. In the case of YBCO as a high temperature superconductor, additional buffer layers are generally not required.

In one embodiment of the present invention, an intermediate layer of $SrRuO_3$, $SrTiO_3$ or a blend thereof is deposited onto the MgO layer so that it is between the MgO layer and the superconducting YBCO layer. The intermediate layer serves as a buffer layer between the MgO layer and the YBCO and assists in lattice matching. This so-called "buffer layer" should have good "structural compatibility" between the MgO or other oriented cubic oxide material deposited in the IBAD or other processes and the YBCO and should have good chemical compatibility with both adjacent layers. By "chemical compatibility" is meant that the intermediate layer does not undergo property-degrading chemical interactions with the adjacent layers. By "structural compatibility" is meant that the intermediate layer has a substantially similar lattice structure with the superconductive material so that the superconductive material can epitaxially grow on this intermediate layer. The intermediate layer is generally from about 25 nm to about 100 nm in thickness, preferably from about 40 nm to about 60 nm in thickness. The intermediate layer is generally deposited at temperatures of greater than about 700° C., preferably at temperatures of from about 700° C. to about 850° C. The choice of temperature can depend upon the selection of material, i.e., whether the intermediate layer is of $SrRuO_3$, $SrTiO_3$ or a blend thereof.

A high temperature superconducting (HTS) layer, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy, a trifluoroacetic acid process or a barium fluoride ($BaF_2$) process and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of up to 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (m Torr) to about 500 mTorr, preferably from about 100 mTorr to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second ('/s) to about 200'/s by changing the laser repetition rate from about 0.1 hertz (Hz) to about 200 Hz. Generally, the laser beam focused on the substrate surface can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

In one embodiment of the present invention illustrated in FIG. 1, a nickel alloy substrate is initially coated with a layer of aluminum phosphate from about 80 nm to 100 nm in thickness deposited by dip coating. Then, a layer of MgO (about 10 nm) is deposited on the aluminum phosphate by ion beam assisted deposition. A homoepitaxial layer of MgO (not shown) is preferably deposited upon the IBAD-MgO layer, the homoepitaxial layer of MgO of about 40 nm in thickness deposited in a process such as electron beam or magnetron sputter deposition. Then, a buffer layer of $SrRuO_3$ of from about 25 nm to about 100 nm in thickness is deposited on the MgO layer. Finally, a layer of YBCO is deposited, e.g., by pulsed laser deposition at a thickness of, e.g., about 1000 nm to 2000 nm.

The present invention is more particularly described in the following examples which are intended as illustrative only, since numerous modifications and variations will be apparent to those skilled in the art.

EXAMPLE 1

On a nickel alloy substrate (Hastelloy C276), was deposited by dip coating a layer of aluminum phosphate about 200 nanometers in thickness. The substrates had been ultrasonically cleaned in soap and water, rinsed with deionized water, rinsed with methanol, blown dry with filtered nitrogen, and mechanically polished to a smoothness (RMS roughness) of about 2 nm. After dipping, the aluminum phosphate layer was annealed by heating at above 750° C. for about 1 hour. Onto this resultant article of nickel alloy substrate and aluminum phosphate was deposited a layer of MgO at room temperature by ion-assisted, electron beam evaporation system similar to that of Wang et al., App. Phys. Lett., v. 71, no. 20, pp. 2955–2957 (1997). The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr. The electron gun heated the MgO source to maintain a deposition rate of about 0.15 nm/sec. The ion-assist gun voltage and current density were about 750 eV and 100 $\mu A/cm^2$ respectively.

A buffer layer of strontium ruthenate (target from Superconductive Components, Inc. Columbus, Ohio) was then deposited upon the IBAD-MgO coated composite substrate by pulsed laser deposition under the typical conditions, i.e., system pressure of 200 mTorr oxygen, substrate temperature between 730° C. and 770° C., 5 pulses per second (pps) and a deposition rate of 0.05 nm/s. The deposited layer of $SrRuO_3$ was 50 nanometers in thickness. The $SrRuO_3$-coated substrate was then coated with a high temperature superconducting layer of YBCO (1.2 $\mu$m) using the following conditions: system pressure of 200 mTorr oxygen; substrate temperature of 750° C.; 8 pps; and, a deposition rate of 2 nm/s).

Metal samples were then patterned into micro-bridges with nominal dimensions of 250 $\mu$m wide by 5 mm long. Superconducting transition temperatures and transition widths were measured using an inductive probe. The sample had a Tc of 90 K and a transition width of 0.4 K. X-ray phi-scans of the YBCO layer showed a $\Delta\phi$ of 8.7°.

Transport critical current ($I_c$) and critical current density ($J_c$) were measured at liquid nitrogen temperature (75 K) and self field using a 1 $\mu$v/cm criterion. The critical current density of the film was 0.56 $MA/cm^2$.

Although the present invention has been described with reference to specific details, it is not intended that such details should be regarded as limitations upon the scope of the invention, except as and to the extent that they are included in the accompanying claims.

What is claimed is:

1. An article comprising:
   a substrate;
   a layer of a metal phosphate material upon the surface of the substrate; and,
   a layer of an oriented cubic oxide material having a rock-salt-like structure upon the metal phosphate material layer.

2. The article of claim 1 further including a top-layer of a superconducting material upon the oriented cubic oxide material layer.

3. The article of claim 1 wherein said superconducting material is YBCO.

4. The article of claim 1 wherein the substrate is a flexible polycrystalline metal.

5. The article of claim 4 further including a strontium ruthenate buffer layer between the oriented cubic oxide material layer and a top-layer of a superconducting material.

6. The article of claim 1 wherein the layer of an oriented cubic oxide material having a rock-salt-like structure is deposited by ion beam assisted deposition.

7. The article of claim 6 further including a layer of homoepitaxial oriented cubic oxide material having a rock-salt-like structure between the ion beam assisted deposited cubic oxide material layer and the strontium ruthenate layer.

8. The article of claim 7 further including a top-layer of a superconducting material upon the at least one layer of a buffer material.

9. The article of claim 1 wherein the metal phosphate is aluminum phosphate.

10. The article of claim 5 wherein the metal phosphate is aluminum phosphate.

11. The article of claim 1 wherein the oriented cubic oxide material layer is magnesium oxide.

12. A thin film template structure for subsequent epitaxial thin film deposition comprising:
    a polycrystalline flexible metal substrate;
    a layer of an a metal phosphate upon the surface of the polycrystalline flexible metal substrate; and,
    a layer of an oriented cubic oxide material having a rock-salt-like structure upon the metal phosphate layer.

13. The thin film template structure of claim 12 wherein the thin film template structure further include a layer of $SrTi_xRu_{1-x}O_3$ where $0 \leq x \leq 1$ upon the layer of an oriented cubic oxide material.

14. The thin film template structure of claim 12 wherein the oriented cubic oxide material layer is magnesium oxide.

15. The thin film template structure of claim 12 wherein the metal phosphate is aluminum phosphate.

16. The thin film template structure of claim 14 wherein the thin film template structure further include a layer of $SrTi_xRu_{1-x}O_3$ where $0 \leq x \leq 1$ upon the layer of an oriented cubic oxide material.

* * * * *